(12) United States Patent
Chang et al.

(10) Patent No.: US 8,502,325 B2
(45) Date of Patent: Aug. 6, 2013

(54) METAL HIGH-K TRANSISTOR HAVING SILICON SIDEWALLS FOR REDUCED PARASITIC CAPACITANCE

(75) Inventors: Leland Chang, New York, NY (US); Jeffrey W. Sleight, Ridgefield, CT (US); Isaac Lauer, Mahopac, NY (US); Renee T. Mo, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/432,395

(22) Filed: Mar. 28, 2012

(65) Prior Publication Data
US 2012/0187506 A1    Jul. 26, 2012

Related U.S. Application Data

(60) Division of application No. 12/880,478, filed on Sep. 13, 2010, now Pat. No. 8,216,907, which is a continuation-in-part of application No. 11/852,359, filed on Sep. 10, 2007, now Pat. No. 7,776,732, and a division of application No. 12/539,842, filed on Aug. 12, 2009, now Pat. No. 7,843,007, and a division of application No. 12/539,860, filed on Aug. 12, 2009, now Pat. No. 7,855,135.

(51) Int. Cl.
| H01L 21/70 | (2006.01) |
| H01L 27/12 | (2006.01) |
| H01L 21/02 | (2006.01) |
| H01L 29/78 | (2006.01) |
| H01L 21/338 | (2006.01) |
| H01L 21/8238 | (2006.01) |
| H01L 21/336 | (2006.01) |
| H01L 21/76 | (2006.01) |
| H01L 21/3205 | (2006.01) |
| H01L 21/4763 | (2006.01) |

(52) U.S. Cl.
USPC ........... 257/407; 257/350; 257/369; 257/392; 257/410; 257/412; 257/E21.626; 438/184; 438/230; 438/267; 438/303; 438/304; 438/446; 438/595; 438/596

(58) Field of Classification Search
None
See application file for complete search history.

(56) References Cited

U.S. PATENT DOCUMENTS

| 5,773,331 A | 6/1998 | Solomon et al. ............... 438/164 |
| 5,804,499 A | 9/1998 | Dehm et al. ................... 438/592 |

(Continued)

OTHER PUBLICATIONS

"Etching of zirconium oxide, hafnium oxide, and hafnium silicates in dilute hydrofluroric acid solutions", Viral Lowalekar and Srini Raghavan, J. Mater. Res., vol. 19, No. 4, Apr. 2004, pp. 1149-1156.

*Primary Examiner* — Michael Jung
(74) *Attorney, Agent, or Firm* — Harrington & Smith

(57) ABSTRACT

A method forms a metal high dielectric constant (MHK) transistor and includes: providing a MHK stack disposed on a substrate, the MHK stack including a first layer of high dielectric constant material, a second overlying layer, and a third overlying layer, selectively removing only the second and third layers, without removing the first layer, to form an upstanding portion of a MHK gate structure; forming a first sidewall layer on sidewalls of the upstanding portion of the MHK gate structure; forming a second sidewall layer on sidewalls of the first sidewall layer; removing a portion of the first layer to form exposed surfaces; forming an offset spacer layer over the second sidewall layer and over the first layer, and forming in the substrate extensions that underlie the first and second sidewall layers and that extend under a portion but not all of the upstanding portion of the MHK gate structure.

15 Claims, 10 Drawing Sheets

U.S. PATENT DOCUMENTS

| | | | |
|---|---|---|---|
| 6,448,613 B1 | 9/2002 | Yu | 257/344 |
| 6,501,134 B1 | 12/2002 | Krivokapic | 257/350 |
| 6,888,198 B1 | 5/2005 | Krivokapic | 257/347 |
| 7,012,027 B2 | 3/2006 | Perng et al. | 438/710 |
| 7,164,189 B2 | 1/2007 | Huang et al. | 257/632 |
| 7,736,981 B2 | 6/2010 | Chang et al. | 438/299 |
| 7,790,592 B2 | 9/2010 | Chen et al. | 438/592 |
| 7,843,007 B2 * | 11/2010 | Chang et al. | 257/350 |
| 2004/0110351 A1 | 6/2004 | Narasimha | 438/302 |
| 2006/0022270 A1 | 2/2006 | Boyd et al. | 257/351 |
| 2009/0065876 A1 * | 3/2009 | Chang et al. | 257/410 |

* cited by examiner (extension and halos)
Mask P, implant NFET
Mask N, implant PFET Deposit and etch final spacer (ie. Nitride or oxide, PECVD), typically 2-10 nm wide Mask P, implant NFET ▨
(As or P)
Mask N, implant PFET ▧
(B or BF2)
(Deep diffusions)

Deposit and etch final spacer (ie. Nitride or oxide, PECVD), typically 2-10 nm wide Mask P, implant NFET 
(As or P)
Mask N, implant PFET 
(B or BF2)
(Deep diffusions)

METAL HIGH-K TRANSISTOR HAVING SILICON SIDEWALLS FOR REDUCED PARASITIC CAPACITANCE

CROSS-REFERENCE TO RELATED APPLICATIONS

This is a divisional application of U.S. patent application Ser. No. 12/880,478 (filed on 13 Sep. 2010) (now U.S. Pat. No. 8,216,907). Which is itself a continuation-in-part of U.S. patent application Ser. No. 11/852,359 (filed on 10 Sep. 2007) (now U.S. Pat. No. 7,776,732). U.S. patent application Ser. No. 12/539,842 (filed on 12 Aug. 2009) (now U.S. Pat. No. 7,843,007), and U.S. patent Ser. No. 12/539,860 (filed on 12 Aug. 2009) (now U.S. Pat. No. 7,855,135). U.S. patent application Ser. Nos. 12/539,842 and 12/539,860 are divisional applications of U.S. patent application Ser. No. 11/852,359.

BACKGROUND

The exemplary embodiments of this invention relate generally to semiconductor devices and methods to fabricate them and, more specifically, exemplary embodiments of this invention relate to a class of devices known as metal high dielectric constant (high-k or MHK) transistors.

MHK transistors are experiencing extremely active development in the industry. One observed problem relates to the presence of an elevated outer fringe capacitance (Cof), on the order of 40-80 aF/μm. The elevated value of Cof is of concern, in that it at least impairs high frequency operation of the MHK transistor.

In U.S. Pat. No. 7,164,189 B2 Chien-Chao Huang et al. describe a method that includes providing a semiconductor substrate including a polysilicon or a metal gate structure including at least one overlying hardmask layer; forming spacers selected from the group consisting of oxide/nitride and oxide/nitride/oxide layers adjacent the polysilicon or metal gate structure; removing the at least one overlying hardmask layer to expose the polysilicon or metal gate structure; carrying out an ion implant process; carrying out at least one of a wet and dry etching process to reduce the width of the spacers; and, forming at least one dielectric layer over the polysilicon or metal gate structure and spacers in one of tensile and compressive stress.

In U.S Pat. No. 6,448,613 B1 Bin Yu describes a field effect transistor that is fabricated to have a drain overlap and a source overlap to minimize series resistance between the gate and the drain and between the gate and the source of the field effect transistor. The parasitic Miller capacitance formed by the drain overlap and the source overlap is to be reduced by forming a depletion region at the sidewalls of the gate structure of the field effect transistor. The depletion region is formed by counter-doping the sidewalls of the gate structure. The sidewalls of the gate structure at the drain side and the source side of the field effect transistor are doped with a type of dopant that is opposite to the type of dopant within the gate structure. Such dopant at the sidewalls of the gate structure forms a respective depletion region from the sidewall into approximately the edge of the drain overlap and source overlap that extends under the gate structure to reduce the parasitic Miller capacitance formed by the drain overlap and the source overlap.

At least one drawback of this latter approach is that it does not address the reduction of parasitic Miller capacitance when metal-like materials (such as TiN) are used.

SUMMARY

In an exemplary embodiment, a method is disclosed for forming a metal high dielectric constant (MHK) transistor. The method includes providing a MHK stack disposed on a substrate, the MHK stack including a layer of high dielectric constant material and an overlying layer comprised of a metal, the MHK stack having an overlying layer comprised of silicon. The method includes selectively removing only the overlying layer comprised of silicon and the overlying layer comprised of metal, without removing the layer of high dielectric constant material, to form an upstanding portion of a MHK gate structure comprised of an underlying portion of the layer comprised of metal, and an overlying portion of the layer comprised of silicon. The method further includes forming a first sidewall layer comprised of silicon on sidewalls of the upstanding portion of the MHK gate structure, and forming a second sidewall layer comprised of an insulator on sidewalls of the first sidewall layer. The method includes removing a portion of the layer of high dielectric constant material to form exposed surfaces of the layer of high dielectric constant material, forming an offset spacer layer over the second sidewall layer and over the exposed surfaces of the layer of high dielectric constant material, and forming in the substrate extensions that underlie the first and second sidewall layers and that extend under a portion but not all of the upstanding portion of the MHK gate structure.

In another exemplary embodiment, a metal high dielectric constant (MHK) transistor is disclosed that includes a substrate and a MHK gate structure disposed on the substrate between a source region and a drain region, the MHK gate structure including a layer of high dielectric constant material and an overlying layer comprised of a metal, the MHK gate structure further having an overlying layer comprised of silicon, where a lateral extent of the layer of high dielectric constant material is greater than lateral extents of the overlying layer comprised of metal and the overlying layer comprised of silicon. The transistor includes a first sidewall layer comprised of silicon disposed on exposed portions of sidewalls of the MHK gate structure to cover sidewalls of the overlying layer comprised of metal and sidewalls of the overlying layer comprised of silicon, the first sidewall layer also being disposed on and in contact with part of a top surface of the layer of high dielectric constant material. The transistor includes a second sidewall layer comprised of an insulator disposed on and in contact with exposed portions of the single sidewall layer and disposed on and in contact with part of the top surface of the layer of high dielectric constant material. The transistor further includes an offset spacer layer disposed over and physically in contact with exposed portions of the second sidewall layer and exposed portions of the layer of high dielectric constant material, and extensions formed in the substrate that underlie the first and second sidewall layers and that extend under a portion but not all of the upstanding portion of the MHK gate structure.

BRIEF DESCRIPTION OF THE SEVERAL VIEWS OF THE DRAWINGS

The foregoing and other aspects of embodiments of this invention are made more evident in the following Detailed Description of Exemplary Embodiments, when read in conjunction with the attached drawing figures, wherein.

DETAILED DESCRIPTION

Although well-known to those skilled in the art, certain abbreviations that appear in the ensuing description and/or in the figures are defined as follows:
BOX buried oxide
CMOS complementary metal-oxide semiconductor
CVD chemical vapor deposition
FET field effect transistor
$HfO_2$ hafnium oxide
MLD multi-layer deposition
PECVD plasma enhanced chemical vapor deposition
PR photoresist
RIE reactive ion etch
RTA rapid thermal anneal
SOI silicon on insulator
STI shallow trench isolation
TiN titanium nitride
poly polycrystalline silicon
Si silicon The inventors have realized that, as compared to conventional poly-gated FETs, the origin of the increased Cof is due to a lack of sidewall depletion in the metal gate. This added capacitance adds to the Miller capacitance (Cmiller) and thus has a tangible performance impact. It can be determined that there can exist an approximately a 3.2% per 10 aF/μm of Cof increase (assuming that N-type FETS (NFETs) and P-type FETs (PFETs) track together in Cof).

The exemplary embodiments of this invention overcome this problem by providing a silicon sidewall spacer, in combination with a MHK gate, to reduce Cof and thus also reduce Cmiller.

The use of exemplary embodiments of this invention creates a structure with a thin polysilicon or amorphous silicon sidewall that gates the FET extension region. Since the gate sidewall is made to be silicon, the sidewall depletion that occurs beneficially lowers the Cof to similar levels as in poly-silicon gated FETs. Additionally, since primarily only the extension regions are gated with silicon (and therefore a relaxed EOT is present), the scaled EOT in the MHK transistor channel is maintained.

In general, the overall fabrication scheme described below may be standard until the gate stack etch. As in a normal process flow the metal etch stops on the hi-k material (such as on a layer of $HfO_2$). At this step, in accordance with the exemplary embodiments of this invention, deposition occurs of polysilicon (either CVD or PECVD) in the thickness range of about 10-20 nm. Then, using RIB, a thin poly-silicon sidewall gate is formed that is disposed largely over the device extension region. Then, processing may continue as in a conventional MHK process flow, such as by removing the hi-k material and growing MLD nitride and subsequent diffusion spacers.

FIGS. 1A through 1G are each an enlarged cross-sectional view of a semiconductor-based structure and depict metal gate process flow in accordance with the exemplary embodiments of this invention. In these figures, an NFET and a PFET are shown arranged in a side-by-side manner for convenience of description, and not as a limitation upon the practice of the exemplary embodiments of this invention.

Figure 1A:
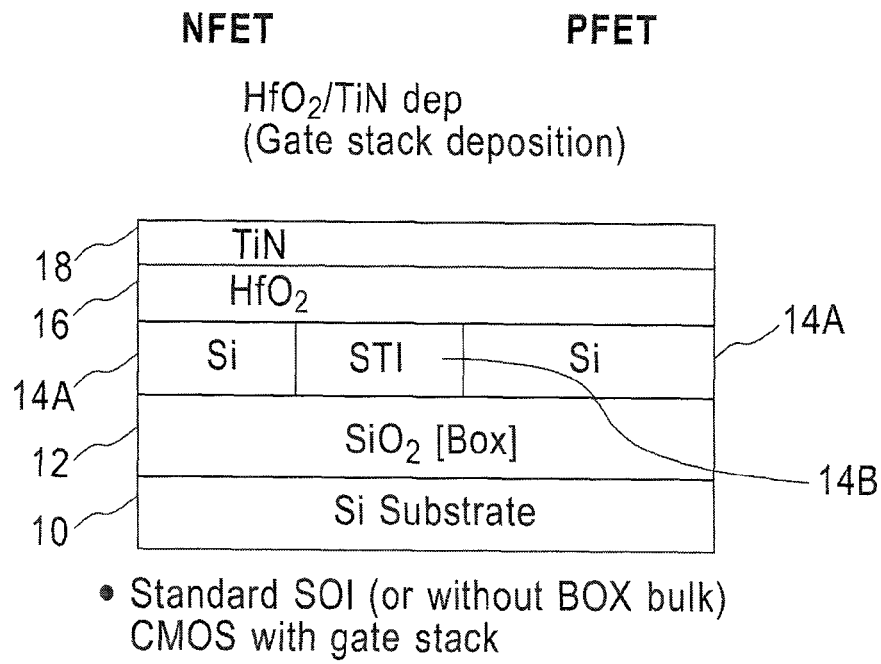
FIGS. 1A through 1G are each an enlarged cross-sectional view of a semiconductor-based structure and depict metal gate process flow in accordance with the exemplary embodiments of this invention.

FIG. 1A shows a Si substrate 10 having an overlying oxide layer 12 (e.g., 3 μm) and overlying Si and STI regions 14A, 14B. A conventional $HfO_2$/TiN deposition may provide gate stack layers 16 and 18, respectively. The $HfO_2$ layer 16 may be considered as the high-k layer (e.g., k in a range of about 20-25, as compared to 3.9 for $SiO_2$) and may have a thickness in a range of about 1-3 nm. The TiN layer 18 may be considered as the metal (or metal-like layer) and may have a thickness of about 10 nm. Layers 16 and 18 together form the (as yet unpatterned) MHK gate stack. This initial structure may represent a standard SOI (or without BOX bulk) CMOS with a MHK gate stack.

Note that the exemplary embodiments of this invention are not limited for use with $HfO_2$ as the high-k material, and other metal oxide-based materials may be used as well, such as a uniform or a composite layer comprised of one or more of $Ta_2O_5$, $TiO_2$, $Al_2O_3$, $Y_2O_3$ and $La_2O_5$. Materials other than TiN that may be used for the metal-containing layer 18 include, but need not be limited to, one or more of Ta, TaN, TaCN, TaSiN, TaSi, AlN, W and Mo.

Figure 1B:
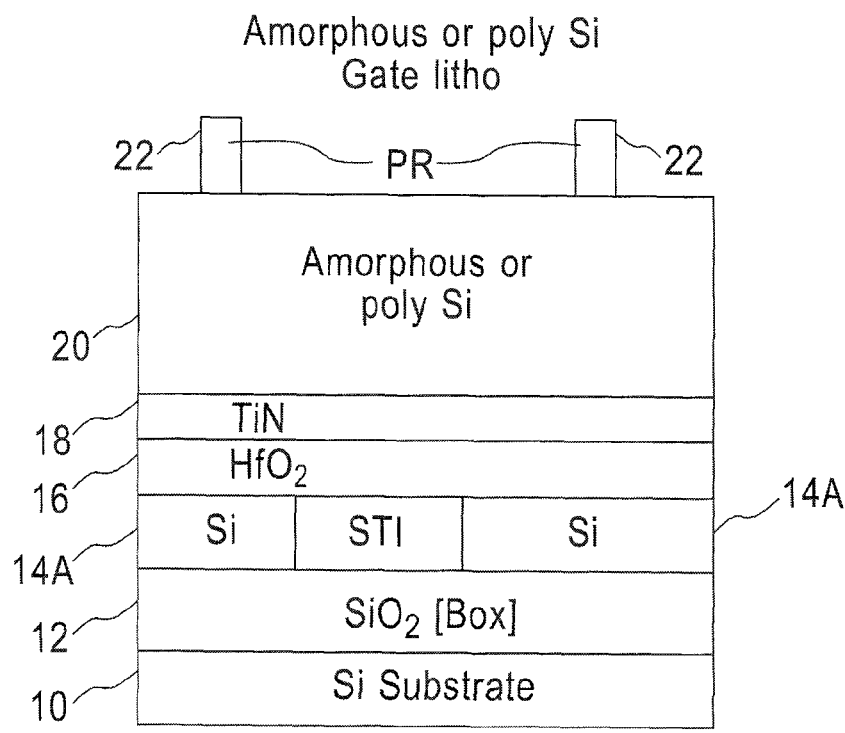

FIG. 1B shows the deposition of an amorphous Si or a poly Si layer 20, which may have a thickness in a range of about 30-100 nm, and subsequent deposition and patterning of PR to form PR regions 22. Each PR region 22 is located where a device gate is desired to be formed.

Figure 1C:
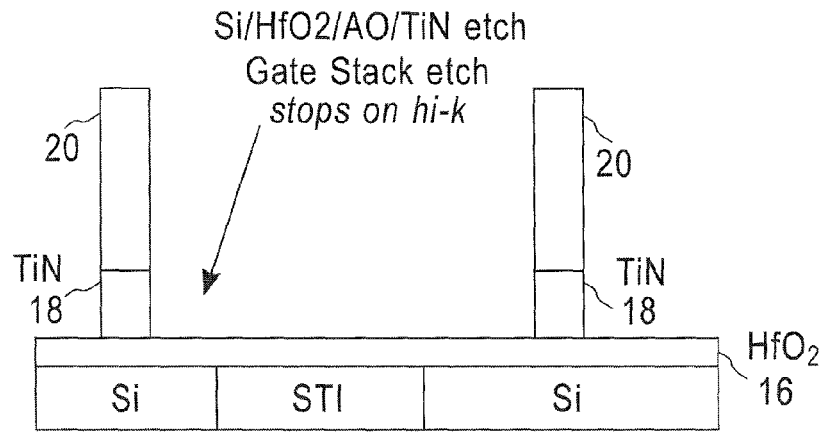

FIG. 1C, depicted without the underlying Si substrate 10 and oxide layer 12 for simplicity, shows the result of a gate stack etch (which also removes the PR regions 22). In accordance with an aspect of this invention, the gate stack etch stops at the high-k layer 16 of $HfO_2$.

Figure 1D:
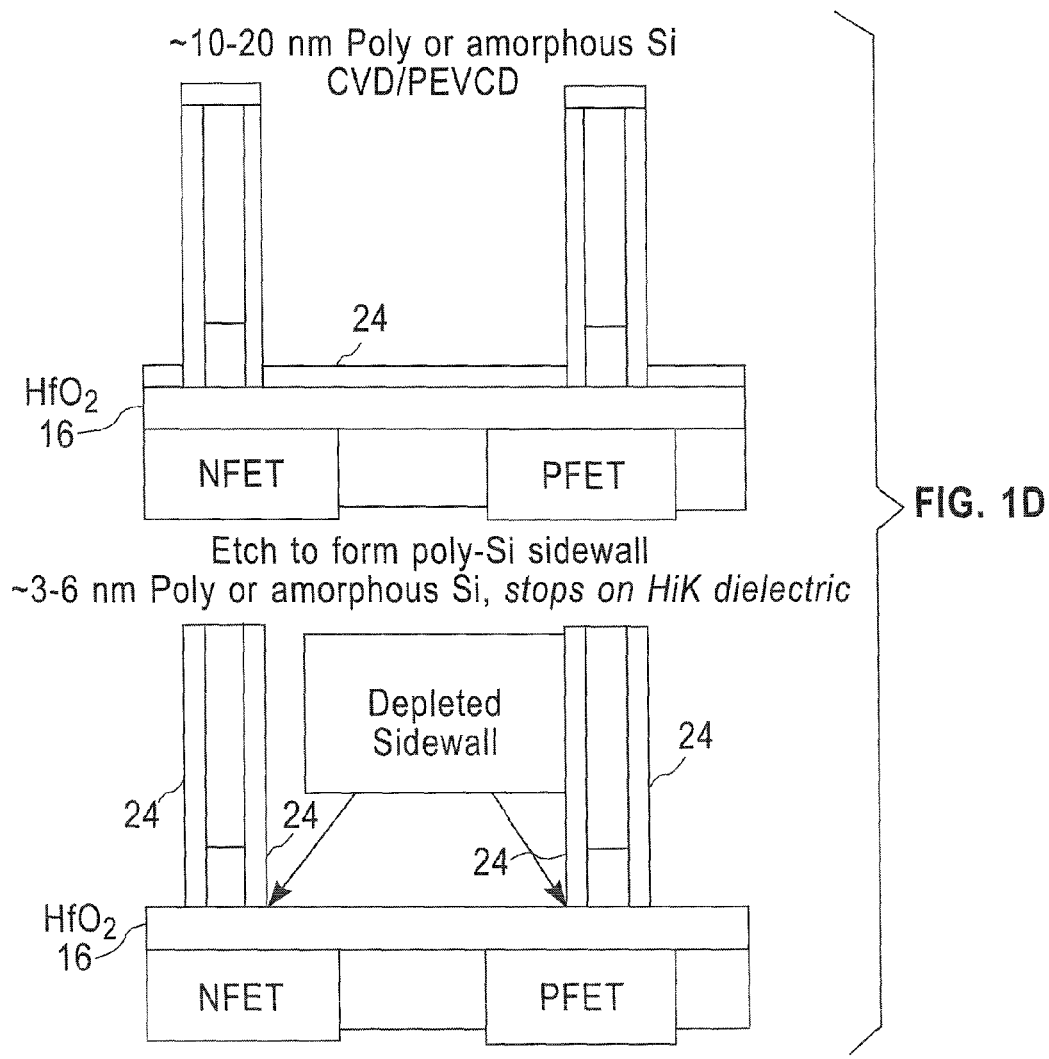

FIG. 1D shows a blanket deposition by, for example, CVD or PECVD of a layer 24 of amorphous Si or polycrystalline (poly) Si. The Si layer 24 may have a thickness in a range of about 10-20 nm. FIG. 1D also shows, further in accordance with the exemplary embodiments, the selective etching of the Si layer 24 so that it remains as a thin layer only on the gate sidewalls, and has a thickness in a range of about 3-6 nm. Again, the etching stops on the high-k layer 16. Over the metal portions (the TiN portions 18) of the underlying gate structure the Si sidewall layer 24 is depleted, which is a desired outcome.

Figure 1E:
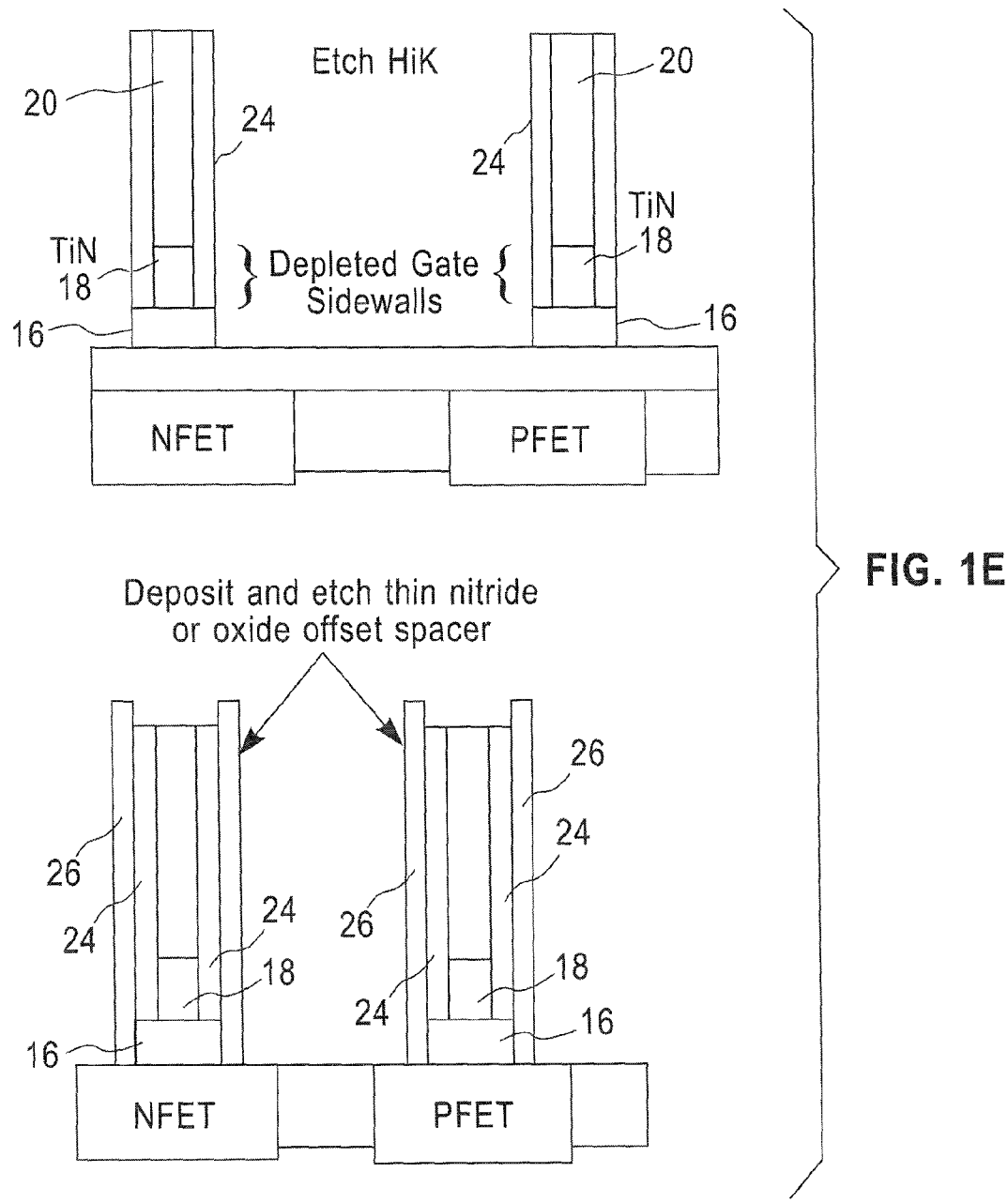

FIG. 1E shows the etching and removal of the high-k $HfO_2$ layer 16, except for that portion within each gate stack and underlying the TiN 18. Note that as a result of the removal of the high-k $HfO_2$ layer 16 a lateral extent of the remaining portion of the layer 16 of high dielectric constant material is greater than a lateral extent of the overlying layer 18 of metal. The remaining portion of the high-k $HfO_2$ layer 16 may be seen to resemble a pedestal-like structure that supports the overlying metal layer 18, the amorphous or polycrystalline Si layer 20, and the amorphous or polycrystalline depleted Si sidewall layer 24.

As but one example a wet etch using a dilute hydrofluoric acid (DHF) solution may be used to remove the high-k $HfO_2$ layer 16, as described in an article "Etching of zirconium oxide, hafnium oxide, and hafnium silicates in dilute hydrofluoric acid solutions", Viral Lowalekar, Srini Raghavan, Materials Research Society, Vol. 19, #4, pgs. 1149-1156.

FIG. 1E also shows a result of depositing and etching a thin (e.g., about 3-6 nm) nitride or oxide offset spacer 26 that covers the Si layer 24 remaining on the gate sidewalls.

The remainder of the metal gate process flow may be conventional for CMOS processing, and can include providing oxide and/or nitride diffusion spacers and implants and final RTA.

Figure 1F:
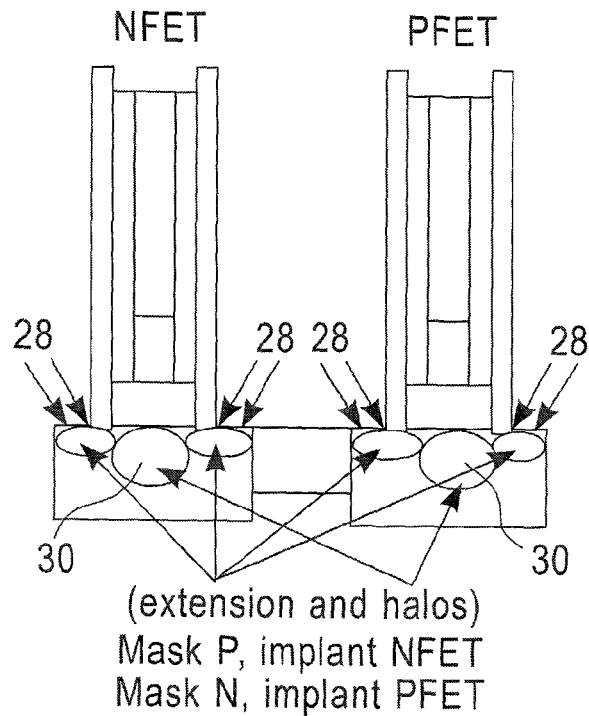
Figure 1G:
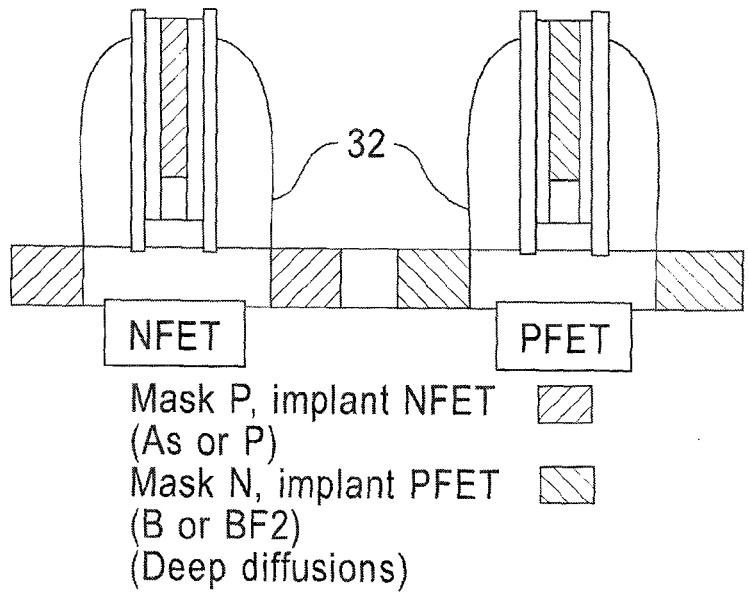

For example, FIG. 1F shows a result of selectively masking alternatively the NFET and PFET so as to implant the other to provide extensions 28 and halos 30, and FIG. 1G shows the result of the deposition and etching of a final spacer 32 (nitride or oxide deposited by PECVD), typically having a thickness of about 2-10 nm. FIG. 1G involves masking the PFET and implanting the NFET (using for example As or P), and masking the NFET and implanting the PFET (using for example B or $BF_2$). Subsequent annealing provides relatively deep diffusions for forming source and drain regions separated by the gate region. Subsequent processing may provide, in a conventional manner, silicide gates and diffusions (typically with Ni or Co) to complete the NFET and PFET transistors.

It may be appreciated that even if one were to experience an increase in extension resistance of about 6%, when applied to the NFET and the PFET this would translate into a resistance penalty on the order of about 1.4%, which is more than compensated for by the improvement in the Cmiller.

The exemplary embodiments of this invention can provide an undoped (intrinsic) Si gate sidewall 24 that doping in the main poly 20 may later diffuse into. The exemplary embodiments of this invention can also provide in-situ doped or implanted silicon (poly or amorphous) sidewalls 24, and both for the NFET and the PFET.

FIGS. 2A through 2F are each an enlarged cross-sectional view of a semiconductor-based structure and depict metal gate process flow in accordance with the exemplary embodiments of this invention. In these figures, an NFET and a PFET are shown arranged in a side-by-side manner for convenience of description, and not as a limitation upon the practice of the exemplary embodiments of this invention.

Figure 2A:
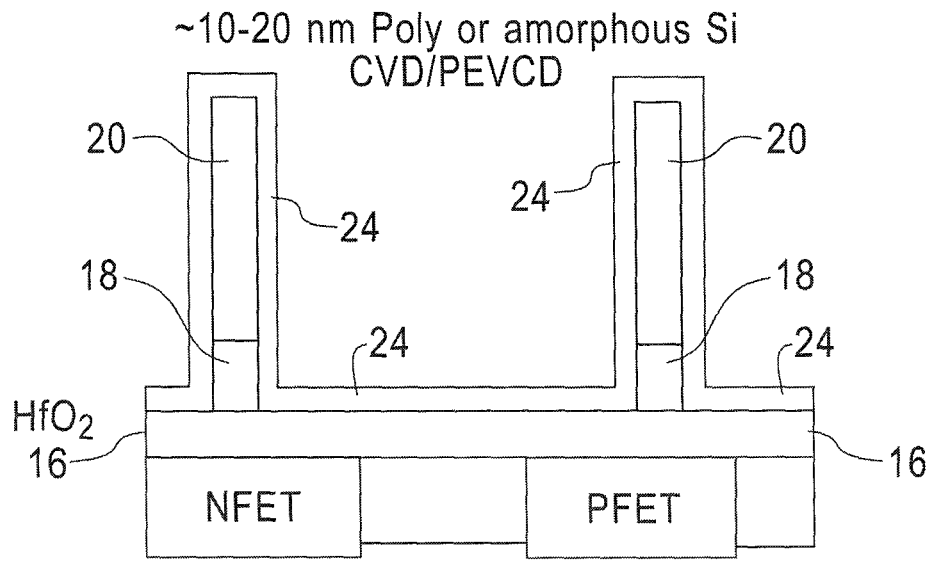
FIGS. 2A through 2G are each an enlarged cross-sectional view of a semiconductor-based structure and depict metal gate process flow in accordance with exemplary embodiments of this invention.

FIG. 2A corresponds to the upper part of FIG. 1D above. That is, FIG. 2A shows the semiconductor based structure after FIGS. 1A through 1C have been performed. FIG. 2A shows a blanket deposition by, for example, CVD or PECVD of a layer 24 of amorphous Si or polycrystalline (poly) Si. The Si layer 24 may have a thickness in a range of about 10-20 nm.

Figure 2B:
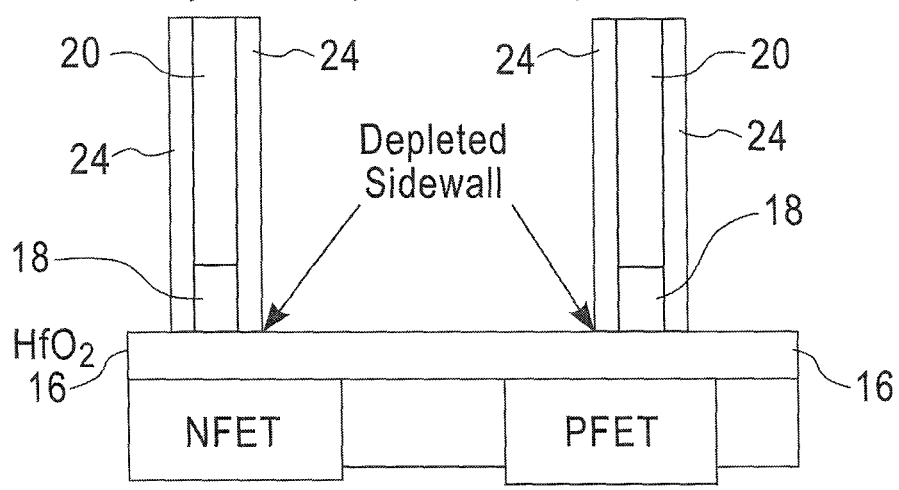

FIG. 2B shows the selective etching of the Si layer 24 so that it remains as a thin layer only on the gate sidewalls, and has a thickness in a range of about 3-6 nm. Again, the etching stops on the high-k layer 16. Over the metal portions (the TiN portions 18) of the underlying gate structure, the Si sidewall layer 24 is depleted, which is a desired outcome.

Figure 2C:
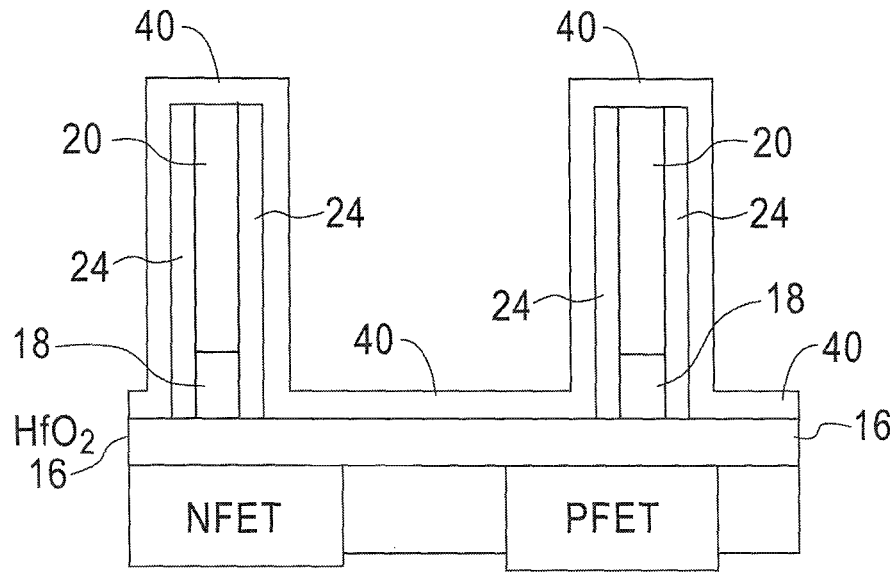

FIG. 2C shows a blanket deposition by, for example, CVD or PECVD of a sidewall layer 40 that is insulating (e.g., a dielectric). Layer 40 can either be an insulator, such as $SiO_2$ or silicon nitride, or something conductive (e.g., Si, SiGe). Since the extension implant follows, use of a metal for sidewall layer 40 would be unlikely. The sidewall layer 40 may have a typical thickness in a range of about 3-20 nm, with a more typical range being 5-10 nm.

Figure 2D:
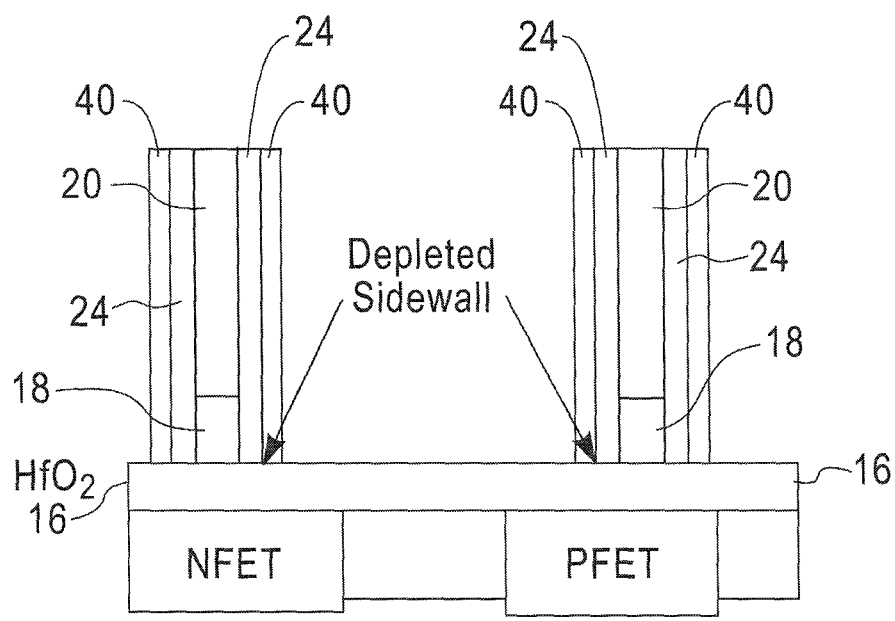

FIG. 2D shows the selective etching of the sidewall layer 40 so that the sidewall layer 40 remains as a layer only on the gate sidewalls, and has the thickness in the range previously described. Again, the etching stops on the high-k layer 16.

Figure 2E:
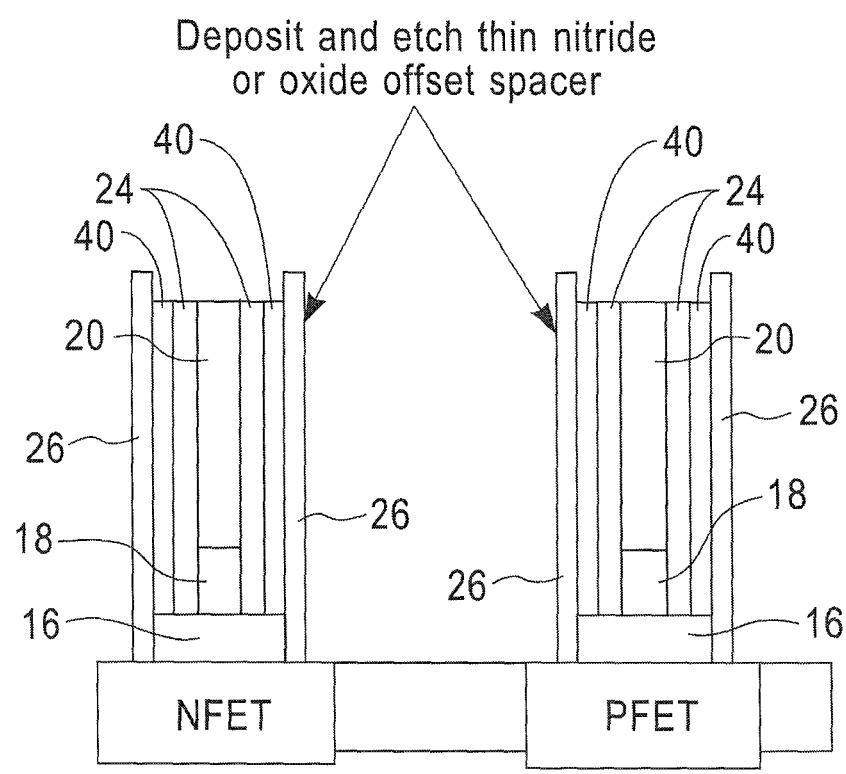

Referring now to FIG. 2E, this figure shows the etching and removal of the high-k $HfO_2$ layer 16, except for that portion within each gate stack and therefore underlying the TiN 18, and that portion also underlying the Si sidewall 24 and the sidewall layer 40. Note that as a result of the removal of the high-k $HfO_2$ layer 16, a lateral extent of the remaining portion of the layer 16 of high dielectric constant material is greater than a lateral extent of the overlying layer 18 of metal. The remaining portion of the high-k $HfO_2$ layer 16 may be seen to resemble a pedestal-like structure that supports the overlying metal layer 18, the amorphous or polycrystalline Si layer 20, the amorphous or polycrystalline depleted Si sidewall layer 24, and the sidewall layer 40.

As but one example, a wet etch using a dilute hydrofluoric acid (DHF) solution may be used to remove the high-k $HfO_2$ layer 16, as described in an article "Etching of zirconium oxide, hafnium oxide, and hafnium silicates in dilute hydrofluoric acid solutions", Viral Lowalekar, Srini Raghavan, Materials Research Society, Vol. 19, #4, pgs. 1149-1156.

Figure 2F:
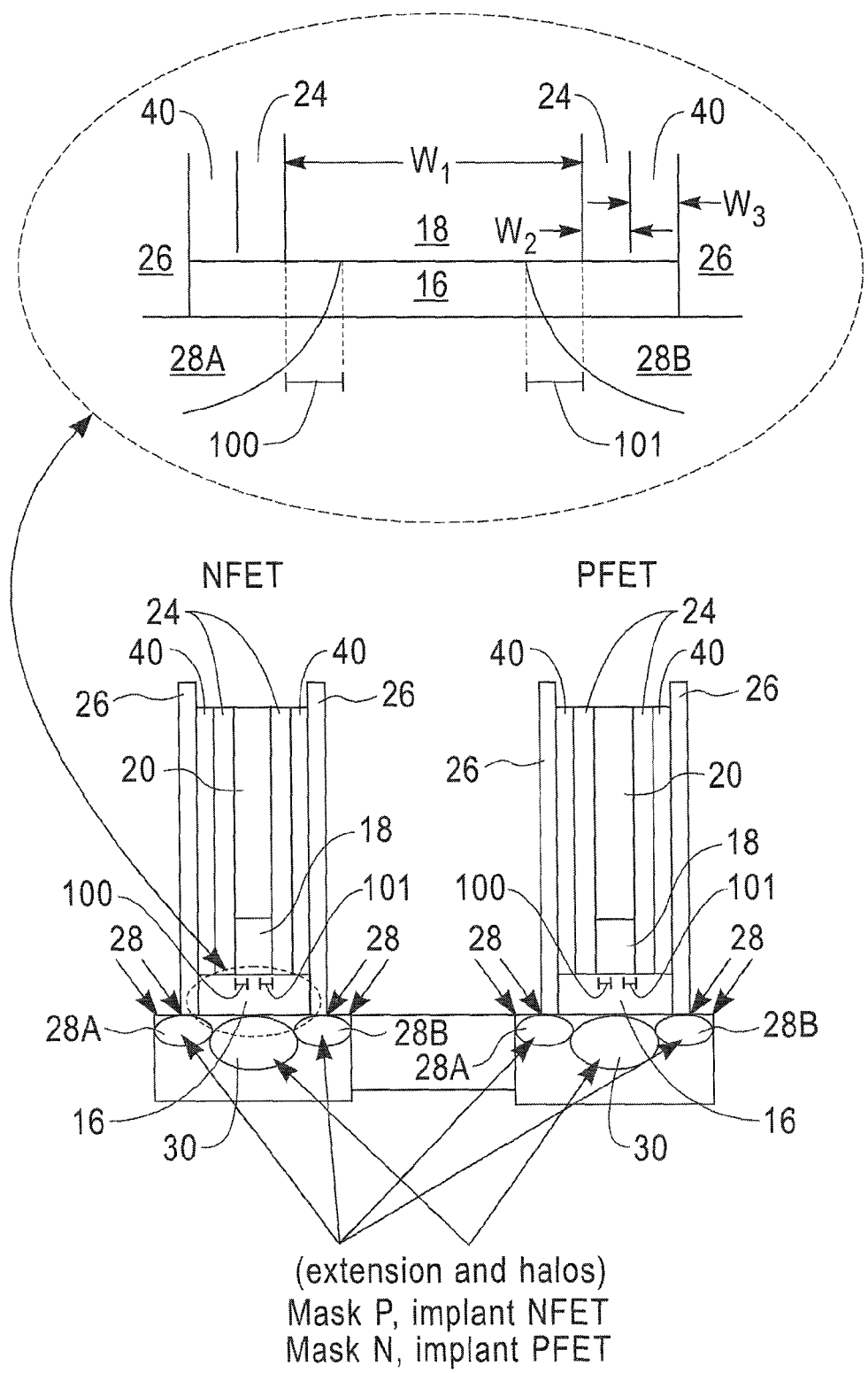

FIG. 2F also shows a result of depositing and etching a thin (e.g., about 3-6 nm) nitride or oxide offset spacer 26 that covers the sidewall layer 40 remaining on the sidewalls of the gate sidewalls 24.

FIG. 2F also shows that the extensions 28 (see extensions 28A and 28B), in an exemplary embodiment, underlie the sidewall 40 and the gate sidewall 24. Additionally, in an exemplary embodiment, the extensions 28 extend under the gate, e.g., the metal portion 18, by an overlap distance 100, 101 of about 5-10 nm.

The width ($W_2$) (e.g., thickness) of gate sidewall 24 is in a range of about 10-20 nm. The width ($W_3$) (e.g., thickness) of sidewall 40 is in a range of about 3-20 nm. The width ($W_1$) of the gate (e.g., metal portion 18) is in a range of about 5-30 nm. The offset spacer 26 has a width/thickness of about 3-6 nm. The sidewall 40 (e.g., second spacer 40) allows a designer to tune overlap capacitance. as does selection of the overlap distance 100, 101, The overlap of this device as shown so is almost zero. The dopants will not diffuse to the distance 100/101 until the final RTA is performed (step noted in section 41). For typical CMOS thermal flows, for proper activation of dopants, a lateral diffusion of 10-20 nm is common, so the sum of layers 26 and 40 would typically be on the order of 10-20nm. To avoid high resistances, one typically wants the dopant to move in at least 5 nm into the channel (100/101 minimum preferred distance).

Figure 2G:
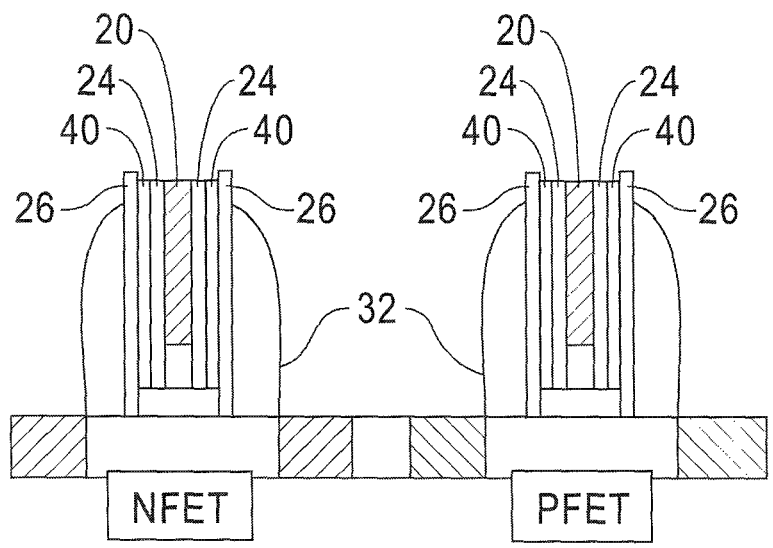
Figure 2G:
Figure 2G:

The remainder of the metal gate process flow may be conventional for CMOS processing, and can include providing oxide and/or nitride diffusion spacers and implants and final RTA. For example, FIG. 2F shows a result of selectively masking alternatively the NFET and PFET so as to implant the other to provide extensions 28 and halos 30, and FIG. 2G shows the result of the deposition and etching of a final spacer 32 (nitride or oxide deposited by PECVD), typically having a thickness of about 2-10 nm. FIG. 2G involves masking the PFET and implanting the NFET (using for example As or P), and masking the NFET and implanting the PFET (using for example B or $BF_2$). Subsequent annealing provides relatively deep diffusions for forming source and drain regions separated by the gate region. Subsequent processing may provide, in a conventional manner, silicide gates and diffusions (typically with Ni or Co) to complete the NFET and PFET transistors.

It can be appreciated that the MHK device fabrication processes described above are compatible with CMOS semiconductor processing methodology.

Figure 3:
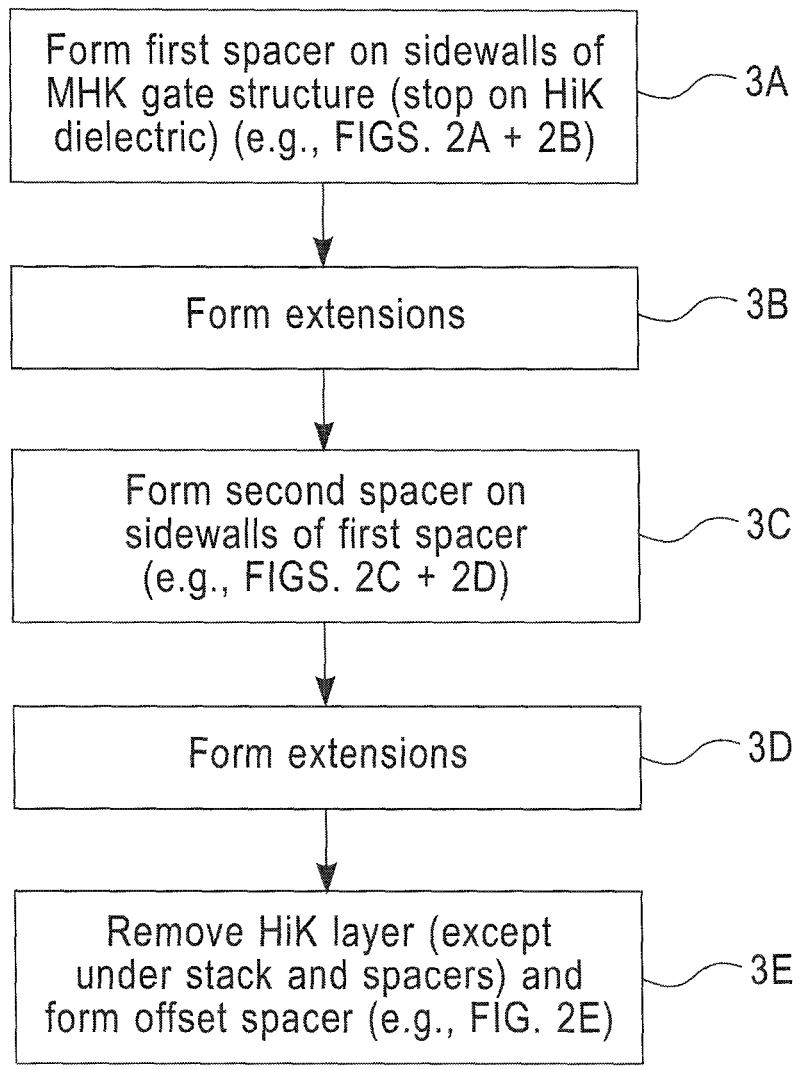
FIG. 3 is a portion of an illustrative method for forming an MHK transistor.

It is noted that FIGS. 2A-2G illustrate one exemplary sequence for creating an MHK transistor. However, many other sequences are possible. For example, FIG. 3 shows a portion of an illustrative method for forming an MHK transistor. In block 3A, the first spacer (e.g., gate sidewall 24) is formed on sidewalls of the MHK gate structure, with a stop on the HiK dielectric, the $HfO_2$ layer 16 (see, e.g., FIGS. 2A and 2B and associated text). Block 3B illustrates one potential location in the process where extensions may be formed. For instance, implantation could be used to implant through the $HfO_2$ layer 16 to form the extensions 28.

In block 3C, the second spacer (e.g., sidewall 40) is formed on the sidewalls of the first spacer. See, e.g., FIGS. 2C and 2D and associated text. Block 3D illustrates another potential location in the process where extensions may be formed. For instance, implantation could be used to implant through the $HfO_2$ layer 16 to form the extensions 28. Typically, only one of blocks 3B or 3D would be performed. In block 3E, the HiK layer ($HfO_2$ layer 16) is removed, except under the stack and spacers. The offset spacer 26 is also formed. See, e.g., FIG. 2E and associated text. Processing continues as described above in reference to FIGS. 2F and 2G.

Various modifications and adaptations may become apparent to those skilled in the relevant arts in view of the foregoing description, when read in conjunction with the accompanying drawings and the appended claims. As but some examples, the use of other similar or equivalent MHK material systems may be attempted by those skilled in the art. However, all such and similar modifications of the teachings of this invention will still fall within the scope of this invention.

For example, it should be noted again that the exemplary embodiments of this invention are not limited for use with MHK gate structures comprised only of $HfO_2$ and TiN. As non-limiting examples, a $ZrO_2$ or a $HfSi_xO_y$ material may be used instead, as both exhibit a high dielectric constant (k of approximately 20-25) needed to provide a larger equivalent oxide thickness. In addition, the various layer thicknesses, material types, deposition techniques and the like that were discussed above are not be construed in a limiting sense upon the practice of this invention.

Furthermore, some of the features of the examples of this invention may be used to advantage without the corresponding use of other features. As such, the foregoing description should be considered as merely illustrative of the principles, teachings, examples and exemplary embodiments of this invention, and not in limitation thereof.

What is claimed is:

1. A metal high dielectric constant (MHK) transistor, comprising:
    a substrate;
    a MHK gate structure disposed on the substrate between a source region and a drain region, the MHK gate structure comprising a layer of high dielectric constant material and an overlying layer comprised of a metal, the MHK gate structure further having an overlying layer comprised of silicon, where a lateral extent of the layer of high dielectric constant material is greater than lateral extents of the overlying layer comprised of metal and the overlying layer comprised of silicon, the overlying layer comprised of metal and the overlying layer comprised of silicon forming an upstanding portion of the MBK gate structure;
    a first sidewall layer comprised of silicon disposed on exposed portions of sidewalls of the MHK gate structure to cover sidewalls of the overlying layer comprised of metal and sidewalls of the overlying layer comprised of silicon, the first sidewall layer also being disposed on and in contact with part of a top surface of the layer of high dielectric constant material;
    a second sidewall layer disposed on and in contact with exposed portions of the first sidewall layer and disposed on and in contact with part of the top surface of the layer of high dielectric constant material;
    an offset spacer layer disposed over and physically in contact with exposed portions of the second sidewall layer and exposed portions of the layer of high dielectric constant material; and
    extensions formed in the substrate that underlie the first and second sidewall layers and that extend under a portion but not all of the upstanding portion of the MHK gate structure, wherein each substrate extension overlaps the upstanding portion of the MHK gate structure by an overlap distance.

2. The MHK transistor of claim 1, wherein the overlap distance is about 5 to 10 nanometers.

3. The MHK transistor of claim 1, where the layer of high dielectric constant material is comprised of at least one of $HfO_2$, $Ta_2O_5$, $TiO_2$, $Al_2O_3$, $Y_2O_3$ and $La_2O_5$.

4. The MHK transistor of claim 1, where the overlying layer comprised of metal is comprised of at least one of TiN, Ta, TaN, TaCN, TaSiN, TaSi, AlN, W and Mo.

5. The MHK transistor of claim 1, where the first sidewall layer is comprised of at least one of amorphous silicon or polycrystalline silicon.

6. The MHK transistor of claim 1, where the metal high dielectric constant (MHK) transistor is a P-type field effect transistor.

7. The MHK transistor of claim 1, where the metal high dielectric constant (MHK) transistor is an N-type field effect transistor.

8. The MHK transistor of claim 1, further comprising a final spacer layer formed over exposed surfaces of the offset spacer layer.

9. The MHK transistor of claim 8, further comprising the source and drain regions formed in the substrate.

10. The MHK transistor of claim 9, wherein the extensions at least partially underlie the first sidewall layer.

11. The MHK transistor of claim 1, wherein the first sidewall layer has a thickness in a range of about three to six nanometers.

12. The MHK transistor of claim 1, wherein the second sidewall layer is an insulator.

13. The MHK transistor of claim 1, wherein the second sidewall layer is conductive.

14. The MHK transistor of claim 1, where the layer of high dielectric constant material is comprised of $ZrO_2$.

15. The MHK transistor of claim 1, where the layer of high dielectric constant material is comprised of $HfSi_xO_y$.

* * * * *